United States Patent [19]

Duncan

[11] Patent Number: 4,909,897

[45] Date of Patent: Mar. 20, 1990

[54] LOCAL OXIDATION OF SILICON PROCESS

[75] Inventor: Shane Duncan, Northamptonshire, England

[73] Assignee: Plessey Overseas Limited, Ilford, England

[21] Appl. No.: 346,028

[22] PCT Filed: Aug. 17, 1987

[86] PCT No.: PCT/GB87/00575

§ 371 Date: Jun. 14, 1989

§ 102(e) Date: Jun. 14, 1989

[87] PCT Pub. No.: WO89/01702

PCT Pub. Date: Feb. 25, 1989

[30] Foreign Application Priority Data

Jun. 17, 1986 [GB] United Kingdom ............... 8614667

[51] Int. Cl.$^4$ ..................... H01L 21/306; B44C 1/22; C03C 15/00; C03C 25/06

[52] U.S. Cl. .................................. 156/649; 156/653; 156/657; 156/661.1; 156/662; 437/239; 437/241; 437/61

[58] Field of Search ............. 156/643, 646, 648, 649, 156/651, 653, 657, 659.1, 661.1, 662; 204/192.32, 192.36; 437/29, 4, 156, 61, 67, 72, 228, 238, 239, 241; 357/23.11, 41, 49

[56] References Cited

U.S. PATENT DOCUMENTS

| | | | |
|---|---|---|---|
| 4,333,965 | 6/1982 | Chow et al. | 156/649 X |
| 4,398,992 | 8/1983 | Fang et al. | 156/649 X |
| 4,637,128 | 1/1987 | Mizutani | 156/649 X |

FOREIGN PATENT DOCUMENTS

| | | |
|---|---|---|
| 0095328 | 11/1983 | European Pat. Off. . |
| 2123605 | 2/1984 | United Kingdom . |
| 2192093 | 12/1987 | United Kingdom . |

Primary Examiner—William A. Powell
Attorney, Agent, or Firm—Fleit, Jacobson, Cohn, Price, Holman & Stern

[57] ABSTRACT

A LOCOS process, a process of the type wherein a capped recessed mesa structure (1,3) is defined in single crystal, semiconductor grade, silicon and thereafter, and in the presence of the capping layers (5,7), local oxide (13) is thermally grown to provide an isolation structure. This process is modified (FIG. 3) by introducing a layer (11) of passive oxide deposit to cover the substrate (3), mesa (1) and upper capping layer (7) prior to the thermal growth of further oxide (13). The resulting oxide (13) is then etched back to remove excess material. This modification results in reduced bird's head height non-planarity and also in reduced bird's beak encroachment into the active area of the silicon device (3). Re-entrancy at the base of the bird's head (13) is also eliminated.

3 Claims, 1 Drawing Sheet

LOCAL OXIDATION OF SILICON PROCESS

TECHNICAL FIELD

The present invention concerns improvements in or relating to processes which use local oxidation of silicon (LOCOS) to provide oxide isolation for silicon integrated circuit components.

Following the current demand for very large scale integration (VLSI) and therefore high packing densities, there is a need to scale down current feature sizes and thus to reduce the size and extent of isolating oxide structures.

The invention is intended to have application to processes for both bipolar and MOS device isolation.

BACKGROUND ART

Local oxidation of silicon (LOCOS) has been the standard method of isolation for large-scale integration (LSI) and very large-scale integration (VLSI) circuits for approximately ten years. See, for example Appls, J.A., et al., Philips Research Reports Vol.25 (1970) pages 118-132 and also United Kingdom Patent No: 1208574.

However, several features of the technique have since been identified as having a detrimental effect on the final device structure. The lateral encroachment of the oxide into the active area (bird's beaking) severely limits the scalability of the device and an attempt to reduce this by decreasing the thickness of the field region will cause an increase in interconnect capacitance.

The standard LOCOS isolation technique currently employed involves recessing a silicon surface to form a mesa, and thermally oxidising the exposed silicon surface in steam. The top of the mesa is typically protected from oxidation by a nitride cap which is deposited on a thin stress relief oxide, to ensure minimal defect generation during oxidation. The topography presented by the isolation oxide can cause problems with photolithography prior to metal deposition, where multiple angle reflections from the bird's beak produces a 'necking' effect in subsequent metal depositions. Furthermore, the profile of the bird's head does not provide a suitable surface for metal coverage primarily due to a re-entrancy of the oxide at the bottom of the bird's head/field oxide region. The coupled effect of a large bird's head and a re-entrant step could present severe problems for metal continuity, where cracking or 'mouseholing' may be evident.

Recently, several isolation techniques have been investigated in an attempt to minimise bird's beak encroachment and produce an almost planar surface—See for example Kuang, Yi, C., Moll, J. L., Manoliu, J., IEEE Trans. Electron Dev. vol. Ed-29, no. 4, April 1982; Teng, C., IEEE Trans. Electron Devices vol. Ed-32, no. 2, February 1985 and Hui, J., Voorde, P. V., Moll, J., IEDM 1985 p. 392. In general, these methods involve complex processing steps and are often accompanied by a high defect density during oxidation.

DISCLOSURE OF THE INVENTION

The present invention is intended to provide an alternative to the foregoing remedial processes, one that does not involve difficult processing operations. The aim of the inventive process, as disclosed below, is to provide a more ideal planar surface for subsequent metal coverage, this by reducing the step height of the bird's head/field oxide.

A further aim of the inventive process herein, is to suppress, or at least reduce, bird's beak encroachment, allowing thus more optimal use of the active areas enclosed within the boundaries of the field oxide isolation structure.

In accordance with the invention thus there is provided a local oxidation of silicon process, a process of the type wherein a capped single crystal silicon mesa is defined in a silicon substrate and thereafter an isolating structure of local field oxide is grown by thermal oxidation of the silicon; characterised in that: a layer of passive oxide is deposited upon the surfaces of the mesa cap, the mesa sidewall, and the silicon substrate prior to said thermal oxidation; thermal oxidation is performed in the presence of this layer; and, excess oxide removed thereafter by etching.

The inventive process disclosed here, addresses the problem of surface re-entrancy and bird's head height from two standpoints. Firstly, the deposited layer of oxide relies on being non-conformal to the silicon surface, and thus exaggerates the corners at the bottom and top of the mesa. Secondly, an oxide thickness 0.5 $\mu$m will put oxidation kinetics in the parabolic regime thus effectively reducing any differential oxidation rate between the (100) and (111) crystal planes. The height of the bird's head is significantly reduced primarily due to visco-elastic flow of the oxide around the nitride edge. The presence of an oxide layer on the nitride allows a diffusion path for the expanding surface of oxidising silicon.

BRIEF INTRODUCTION OF THE DRAWINGS

In the drawings accompanying this specification FIGS. 1 to 4 show substrate-and-structure cross-sections for successive stages of this inventive process. The stages shown in FIGS. 1 and 2 are conventional.

DESCRIPTION OF PREFERRED EMBODIMENTS

So that the invention may be better understood preferred embodiments thereof will now be described and reference will be made to the accompanying drawings. The description that follows is given by way of example only.

Figure 1:
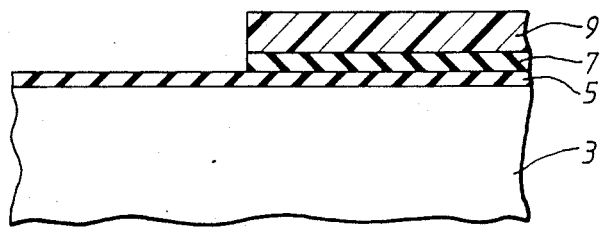
Figure 2:
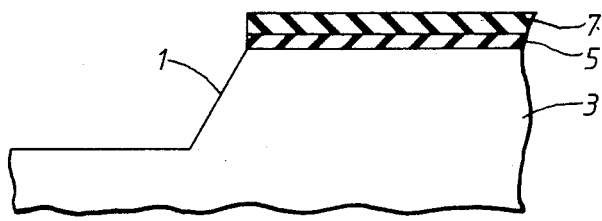

As in the conventional process, a mesa 1 is defined in a single crystal silicon substrate 3. As shown in FIGS. 1 and 2 this is performed by growing a thin first layer 5, a layer of thermal oxide, at the surface of the substrate 3. In a typical process this layer 5 would be approx. 250Å thick. This then is followed by the deposition of a second layer 7, a layer of an oxide-etch resistant material, typically nitride. This is preferably somewhat thicker, typically approx. 1000Å. In the case of nitride this may be performed by a low-pressure chemical vapour deposition technique, the details of which are well known and not therefore detailed here. A layer 9 of resist is then spun onto the surface of the second layer 7. This then is selectively exposed and developed and the exposed part of the second layer 7 removed by an anisotropic etch—for example, by a plasma. An illustrative cross-section of the substrate-and-structure at this stage of the process is shown in FIG. 1. The layer 9 of resist is now stripped off eg. by ashing and the remanent part of the second layer 7 is used as a mask during etch removal of the exposed oxide part of the first layer 5. This may be performed using a selective wet etchant—eg. hydrofluoric acid (HF). Exposed silicon material is then removed using an anisotropic wet etchant, for example, potassium hydroxide etchant isopropyl alcohol (KOH/IPA). This step of the process thus defines a mesa 1 with sloping walls. Typically, this etching step is continued until a depth of approx. 0.6 μm of silicon is removed, which depth corresponds to the desired height of the mesa 1. This capped mesa 1 is shown in FIG. 2.

Figure 3:
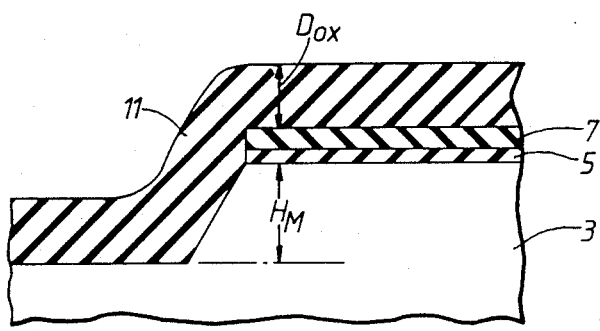

Then next step is a departure from the conventional process. At this stage; and thus prior to the growth of local oxide, a passive oxide deposition (POD) is performed. A layer 11 of low-pressure chemical vapour deposition (LP CVD) oxide is blanket deposited over the recessed mesa 1 and substrate 3. This deposited layer 11 typically can be approx. 0.5 μm thick and is undoped.—See FIG. 3. In this figure, the labels $D_{OX}$ and $H_M$ are used to denote, respectively, the thickness (depth) of the deposited oxide layer 11, and, the height of the mesa 1 above the surrounding surface of the silicon substrate 3.

The final steps of this process then follow in manner similar to the conventional process. At this stage the silicon is oxidised by exposing the oxide covered structure to steam at a raised temperature. This, for example, can be conducted at a temperature of 1050° C. for a period of 8 hours, this allowing oxidation of the silicon to a depth of approx. 0.6 μm. This may be compared with the standard process where typically oxidation is conducted at a temperature of 1000° C. and for a period of 7 hours. It will be noted that due to the presence of an initial thickness of oxide, oxide layer 11, either the temperature or the time, or both, are thus increased to allow consumption of the equivalent thickness of silicon. Excess oxide—typically the same in thickness as the thickness of the original deposited oxide layer 11, approx. 0.5 μm, may then be removed by wet etching eg. using hydrofluoric acid (HF). Active areas then are exposed by wet etch removal of oxide-etch resistant material, eg. nitride 7, and of oxide material 5.

Figure 4:
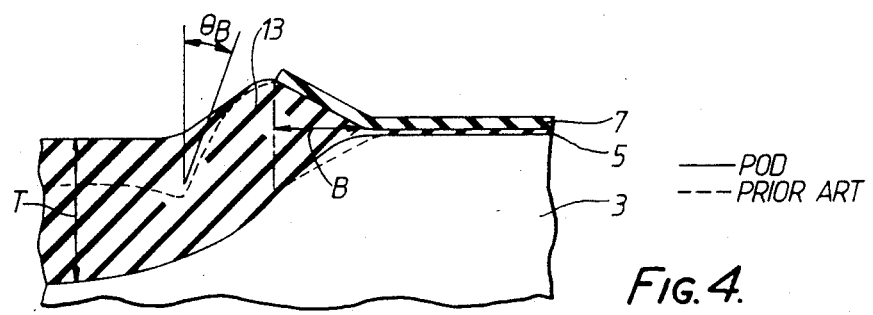

The bird's head/beak structure 13 is depicted in FIG. 4. In this figure, an approximation to a profile produced by this process is shown in bold outline. By way of comparison, an approximate profile produced by conventional processing is also shown, but in broken outline. The thickness of the oxide, and, the penetration length of the "bird's beak" (as measured from the edge of the second layer 7) are depicted respectively by symbols T and B. The slope angle $O_B$ of the "bird's head", as measured relative to the normal to the plane silicon surface, is also labelled.

The inventive process is not restricted to the dimensions specified above. In a series of experiments, conducted to characterise this modified process, various combinations of deposited oxide thickness $D_{OX}$ (0.25 and 0.5 μm), thickness of the nitride layer 7 (500 and 1000Å) and thickness of the pad oxide 5 (375 and 1000Å) were investigated. For these experiments the mesa height $H_M$ was in all cases 0.6 μm. A measure—of—excellence parameter, B/T,—the ratio of beak length to oxide thickness, is tabulated for these combinations—See Table 1. By way of a guideline, a B/T value of 1.0 should be taken as typical for the conventional process:

TABLE 1

| Summary of B/T (+0.1) values determined by experiment | | |
|---|---|---|
| 375Å pad oxide 500Å nitridede | 0.79 | 0.77 |
| 375Å pad oxide 1000Å nitide | 0.87 | 0.92 |
| 1000Å pad oxide 500Å nitride | 0.92 | 0.92 |
| 1000Å pad oxide 1000Å nitride | 1.00 | 1.00 |

The improvements of reduced "bird's beack" encroachment is evident from these results—especially for the lowest thicknesses of pad oxide and nitride (375Å; 500Å).

Micrograph examination also shows there to be considerable etch-back smoothing of the profile at the base of the bird's head. The angle $O_B$ is found to be approx. 45° compared to an angle of 15° subtended by the bird's head after conventional processing. The step height of the bird's head is also found to be 0.5 μm, representing a 50% reduction compared with that found conventionally, typically 1 μm height.

I claim:

1. A local oxidation of silicon process, a process wherein a capped single crystal silicon mesa is defined in a silicon substrate and thereafter an isolating structure of local field oxide is grown by thermal oxidation of the silicon; wherein a layer of passive oxide is deposited upon the surfaces of the mesa cap, the mesa sidewall, and the silicon substrate prior to said thermal oxidation; thermal oxidation is performed in the presence of said layer; and, excess oxide removed thereafter by etching.

2. A process, as claimed in claim 1, wherein the mesa is capped by a layer of pad oxide and on this a layer of nitride, each layer being of thickness 1000Å or less.

3. A process, as claimed in claim 2, wherein the pad oxide and nitride layers are of thickness 375Å or less and 500Å or less, respectively.

* * * * *